United States Patent
Fest

(10) Patent No.: US 9,865,813 B2
(45) Date of Patent: Jan. 9, 2018

(54) METHOD FOR FORMING RESISTIVE MEMORY CELL HAVING A SPACER REGION UNDER AN ELECTROLYTE REGION AND A TOP ELECTRODE

(71) Applicant: Microchip Technology Incorporated, Chandler, AZ (US)

(72) Inventor: Paul Fest, Chandler, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 14/952,559

(22) Filed: Nov. 25, 2015

(65) Prior Publication Data
US 2016/0079527 A1    Mar. 17, 2016

Related U.S. Application Data

(63) Continuation-in-part of application No. 14/184,331, filed on Feb. 19, 2014, now Pat. No. 9,385,313.
(Continued)

(51) Int. Cl.
*H01L 45/00*   (2006.01)
*H01L 27/24*   (2006.01)

(52) U.S. Cl.
CPC ...... *H01L 45/1273* (2013.01); *H01L 27/2463* (2013.01); *H01L 45/08* (2013.01);
(Continued)

(58) Field of Classification Search
CPC ... H01L 45/16; H01L 45/085; H01L 45/1233; H01L 45/1266; H01L 27/1266; H01L 27/2481; H01L 27/249
See application file for complete search history.

(56) References Cited

U.S. PATENT DOCUMENTS 5,687,112 A   11/1997   Ovshinsky ............. 365/163
5,790,455 A    8/1998   Caywood ............ 635/185.06
(Continued)

FOREIGN PATENT DOCUMENTS

CN   101794860 A   8/2010   ......... G11C 11/21
CN   102130145 A   7/2011   ......... H01L 27/24
(Continued)

OTHER PUBLICATIONS

U.S. Final Office Action, U.S. Appl. No. 14/184,034, 16 pages, dated Feb. 10, 2017.
(Continued)

*Primary Examiner* — Laura Menz
*Assistant Examiner* — Candice Y Chan
(74) *Attorney, Agent, or Firm* — Slayden Grubert Beard PLLC

(57) ABSTRACT

A method of forming a resistive memory cell, e.g., CBRAM or ReRAM, includes forming a bottom electrode layer, forming an oxide region of an exposed area of the bottom electrode, removing a region of the bottom electrode layer proximate the oxide region to form a bottom electrode having a pointed tip or edge region. An electrically insulating mini-spacer region is formed adjacent the bottom electrode, and an electrolyte region and top electrode are formed over the bottom electrode and mini-spacer element(s) to define a memory element. The memory element defines a conductive filament/vacancy chain path from the bottom electrode pointed tip region to the top electrode via the electrolyte region. The mini-spacer elements decreases the effective area, or "confinement zone," for the conductive filament/vacancy chain path, which may improve the device characteristics, and may provide an improvement over techniques that rely on enhanced electric field forces.

20 Claims, 16 Drawing Sheets

Related U.S. Application Data

(60) Provisional application No. 62/085,075, filed on Nov. 26, 2014.

(52) U.S. Cl.
CPC .......... *H01L 45/085* (2013.01); *H01L 45/122* (2013.01); *H01L 45/16* (2013.01); *H01L 45/1675* (2013.01); *H01L 45/142* (2013.01); *H01L 45/145* (2013.01); *H01L 45/146* (2013.01)

(56) References Cited

U.S. PATENT DOCUMENTS

| | | | |
|---|---|---|---|
| 5,962,872 A | 10/1999 | Zhang et al. | 257/66 |
| 5,986,931 A | 11/1999 | Caywood | 365/185.06 |
| 6,031,287 A | 2/2000 | Harshfield et al. | 257/734 |
| 6,147,395 A | 11/2000 | Gilgen | 257/529 |
| 6,436,611 B1 | 8/2002 | Lee | 430/314 |
| 9,269,606 B2 | 2/2016 | Fest | |
| 9,281,476 B2 | 3/2016 | Cai et al. | |
| 9,318,702 B2 | 4/2016 | Fest et al. | |
| 9,349,950 B2 | 5/2016 | Walls | |
| 9,362,496 B2 | 6/2016 | Walls et al. | |
| 9,385,313 B2 | 7/2016 | Fest et al. | |
| 9,412,942 B2 | 8/2016 | Walls et al. | |
| 9,444,040 B2 | 9/2016 | Sato et al. | |
| 2002/0036931 A1 | 3/2002 | Lowrey et al. | 365/200 |
| 2002/0039306 A1 | 4/2002 | Lowrey | 365/100 |
| 2004/0085833 A1 | 5/2004 | Hwang et al. | 365/200 |
| 2004/0192009 A1 | 9/2004 | Belyansky et al. | 438/424 |
| 2005/0029505 A1 | 2/2005 | Lowrey | 257/5 |
| 2006/0006443 A1 | 1/2006 | Lowrey et al. | 257/296 |
| 2006/0097238 A1 | 5/2006 | Breuil et al. | 257/4 |
| 2006/0131618 A1 | 6/2006 | Hsueh | 257/246 |
| 2007/0097738 A1 | 5/2007 | Asano et al. | 365/163 |
| 2007/0267618 A1 | 11/2007 | Zaidi et al. | 257/2 |
| 2008/0012079 A1 | 1/2008 | Zaidi | 257/379 |
| 2009/0017591 A1 | 1/2009 | Cervin-lawry et al. | 438/384 |
| 2009/0026438 A1 | 1/2009 | Lin | 257/4 |
| 2009/0096568 A1 | 4/2009 | Hosoi et al. | 338/26 |
| 2009/0200640 A1 | 8/2009 | Hosoi et al. | 257/536 |
| 2010/0019218 A1 | 1/2010 | Chung | 257/4 |
| 2010/0038614 A1 | 2/2010 | Hampton | 257/2 |
| 2010/0252798 A1 | 2/2010 | Baker et al. | 206/503 |
| 2010/0055687 A1 | 3/2010 | Sawyers et al. | 435/6.11 |
| 2010/0084741 A1 | 4/2010 | Andres et al. | 257/536 |
| 2010/0163829 A1 | 7/2010 | Wang et al. | 257/3 |
| 2010/0193762 A1 | 8/2010 | Hsieh et al. | 257/4 |
| 2010/0264396 A1 | 10/2010 | Lung et al. | 257/3 |
| 2011/0147694 A1 | 6/2011 | Song et al. | 257/3 |
| 2011/0175048 A1 | 7/2011 | Sekine et al. | 257/2 |
| 2011/0180775 A1 | 7/2011 | Lin et al. | 257/4 |
| 2011/0291064 A1 | 12/2011 | Marsh et al. | 257/4 |
| 2012/0294065 A1 | 11/2012 | Hong et al. | 365/148 |
| 2012/0313071 A1 | 12/2012 | Gopalan | 257/4 |
| 2012/0319072 A1 | 12/2012 | Wei et al. | 257/4 |
| 2013/0001501 A1 | 1/2013 | Sills | 257/4 |
| 2013/0001503 A1 | 1/2013 | Gallo | 257/4 |
| 2013/0082231 A1 | 4/2013 | Tada et al. | 257/4 |
| 2013/0112936 A1 | 5/2013 | Wei et al. | 257/4 |
| 2013/0214234 A1 | 8/2013 | Gopalan et al. | 257/3 |
| 2013/0252431 A1 | 9/2013 | Chen et al. | 438/702 |
| 2013/0336046 A1 | 12/2013 | Oh | 365/163 |
| 2014/0264245 A1 | 9/2014 | Walls et al. | 257/4 |
| 2015/0236255 A1 | 8/2015 | Fest et al. | 257/3 |
| 2015/0236258 A1 | 8/2015 | Fest et al. | 257/3 |
| 2015/0236527 A1 | 8/2015 | Goldman | 320/1.34 |
| 2016/0190441 A1 | 6/2016 | Walls et al. | 257/4 |
| 2016/0190442 A1 | 6/2016 | Fest et al. | 257/4 |
| 2016/0380192 A1 | 12/2016 | Sato et al. | 257/4 |

FOREIGN PATENT DOCUMENTS

| | | | |
|---|---|---|---|
| CN | 102738386 A | 10/2012 | H01L 27/24 |
| DE | 102007049786 A1 | 4/2009 | H01L 27/24 |
| EP | 1355365 A2 | 10/2003 | H01L 27/10 |
| EP | 2202816 A1 | 6/2010 | H01L 27/24 |
| EP | 2267775 A2 | 12/2010 | G11C 16/04 |
| EP | 2339585 A1 | 6/2011 | G11C 16/00 |
| WO | 2012/057772 A1 | 5/2012 | H01L 21/8247 |
| WO | 2012/167286 A1 | 12/2012 | G11C 11/34 |
| WO | 2014/164015 A1 | 10/2014 | H01L 45/00 |

OTHER PUBLICATIONS

International Search Report and Written Opinion, Application No. PCT/US2015/062758, 12 pages, dated Mar. 2, 2016.
U.S. Final Office Action, U.S. Appl. No. 14/184,034, 29 pages, dated Dec. 16, 2015.
U.S. Final Office Action, U.S. Appl. No. 14/183,831, 13 pages, dated Feb. 2, 2016.
Kozicki, M., "Nanoscale Memory Elements Based on Solid-State Electrolytes," IEEE Transactions on Nano Technology, vol. 4, No. 3, 8 pages, May 2005.
Chen, a., "Non-Volatile Resistive Switching for Advanced Memory Applications," IEDM Technical Digest, 4 pages, 2005.
Balakrishnan, M. et al., "A Low Power Non-Volatile Memory Element Based on Copper in Deposited Silicon Oxide," Non-Volatile Memory Technology Symposium, 7 pages, 2006.
Schindler, C. et al., "Bipolar and Unipolar Resistive Switching in CU-Doped SiO2," IEEE Transactions on Electron Devices, vol. 54, No. 10, 7 pages, 2007.
Chen, A., "Ionic Memories: Status and Challenges," Non-Volatile Memory Technology Symposium, 5 pages, 2008.
Valov, I. et al., "Electrochemical Metallization Memories—Fundamentals, Applications, Prospects," Nanotechnology, vol. 22, No. 25, 22 pages, Jun. 24, 2011.
Jou, S. et al., "Resistance Switching Properties in Cu/Cu-SiO2/TaN Device," Proceeding World Congress on Engineering, vol. 2, 4 pages, Jul. 6, 2011.
Yang, L. et al., "Linear Scaling of Reset Current Down to 22-nm Node for a Novel CuxSiyO RRAM," IEEE Electron Device Letters, vol. 33, No. 1, 3 pages, 2012.
International Search Report and Written Opinion, Application No. PCT/US2014/022194, 11 pages, dated May 16, 2014.
International Search Report and Written Opinion, Application No. PCT/US2014/020188, 10 pages, dated May 13, 2014.
International Search Report and Written Opinion, Application No. PCT/US2014/019868, 10 pages, dated Jun. 5, 2014.
International Search Report and Written Opinion, Application No. PCT/US2014/019906, 12 pages, dated Jul. 2, 2014.
International Search Report and Written Opinion, Application No. PCT/US2015/016268, 9 pages, dated May 4, 2015.
International Search Report and Written Opinion, Application No. PCT/US2015/016244, 11 pages, dated May 7, 2015.
International Search Report and Written Opinion, Application No. PCT/US2015/016259, 16 pages, dated May 6, 2015.
International Search Report and Written Opinion, Application No. PCT/US2015/016321, 11 pages, dated Jul. 14, 2015.
U.S. Non-Final Office Action, U.S. Appl. No. 14/183,792, 23 pages, dated Jul. 8, 2015.
U.S. Non-Final Office Action, U.S. Appl. No. 14/183,831, 18 pages, dated Jul. 9, 2015.
U.S. Non-Final Office Action, U.S. Appl. No. 14/183,674, 26 pages, dated Jul. 8, 2015.
U.S. Non-Final Office Action, U.S. Appl. No. 14/184,177, 12 pages, dated Jun. 19, 2015.
U.S. Non-Final Office Action, U.S. Appl. No. 14/183,738, 26 pages, dated Jul. 16, 2015.
U.S. Non-Final Office Action, U.S. Appl. No. 14/183,953, 27 pages, dated Jul. 31, 2015.
U.S. Final Office Action, U.S. Appl. No. 14/184,331, 10 pages, dated Nov. 12, 2015.
U.S. Non-Final Office Action, U.S. Appl. No. 14/184,034, 20 pages, dated Jul. 5, 2016.
International Search Report and Written Opinion, Application No. PCT/US2015/016334, 11 pages, dated Dec. 7, 2015.

(56) References Cited

OTHER PUBLICATIONS

U.S. Non-Final Office Action, U.S. Appl. No. 14/184,034, 23 pages, dated Jun. 16, 2017.
Taiwan Office Action, Application No. 103108885, 15 pages, dated Jun. 6, 2017.
U.S. Non-Final Office Action, U.S. Appl. No. 15/065,193, 33 pages, dated Jul. 14, 2017.
U.S. Final Office Action, U.S. Appl. No. 15/065,354, 21 pages, dated Aug. 28, 2017.
Chinese Office Action, Application No. 201480011426.5, 9 pages, dated Apr. 1, 2017.
U.S. Non-Final Office Action, U.S. Appl. No. 15/065,354, 22 pages, dated Feb. 24, 2017.
U.S. Non-Final Office Action, U.S. Appl. No. 15/200,322, 16 pages, dated Mar. 1, 2017.
U.S. Non-Final Office Action, U.S. Appl. No. 15/262,923, 33 pages, dated Aug. 10, 2017.
U.S. Notice of Allowance, U.S. Appl. No. 15/200,322, 27 pages, dated Oct. 4, 2017.

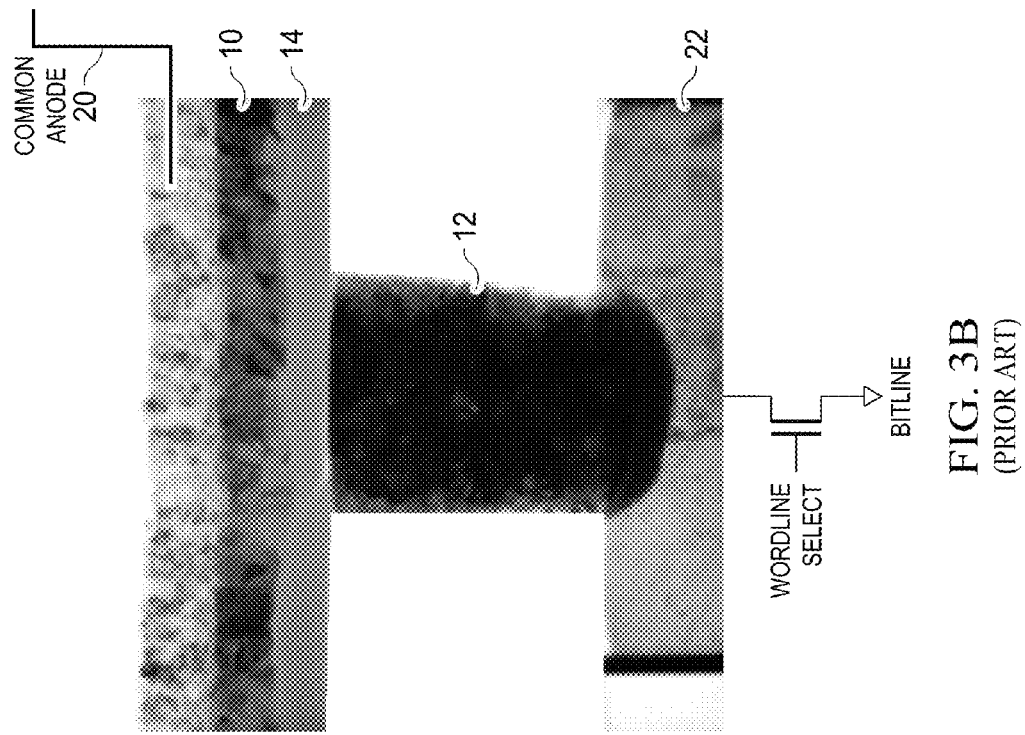
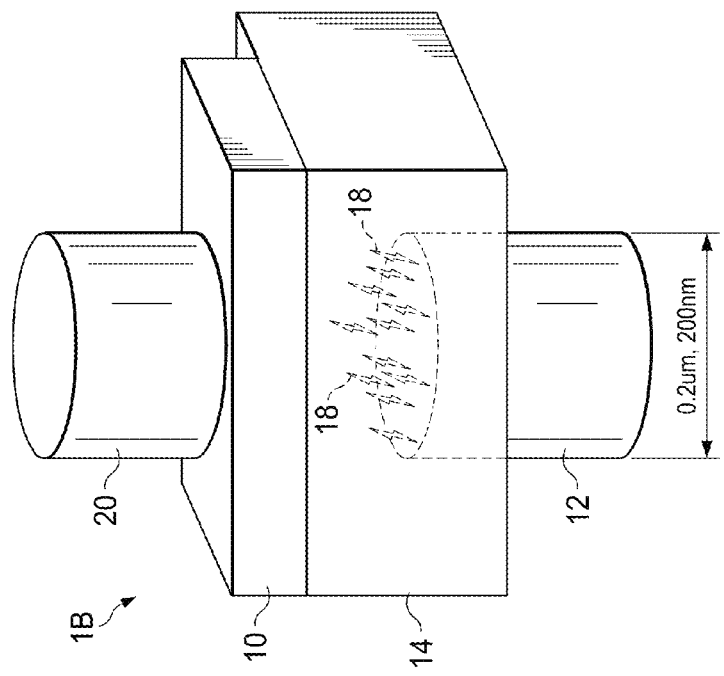
FIG. 3A (PRIOR ART)
FIG. 3B (PRIOR ART)

12
METHOD FOR FORMING RESISTIVE MEMORY CELL HAVING A SPACER REGION UNDER AN ELECTROLYTE REGION AND A TOP ELECTRODE

RELATED APPLICATIONS

This application is a continuation in part of co-pending U.S. application Ser. No. 14/184,331 ("the '331 Non-Provisional Application") filed on Feb. 19, 2014, and claims priority to U.S. Provisional Application No. 62/085,075 ("the '075 Provisional application) filed on Nov. 26, 2014. This application also relates to U.S. non-provisional application U.S. Ser. No. 14/184,268 ("the '268 Non-Provisional Application"). The entire contents of the '331 Non-Provisional application, the '075 Provisional application, and the '268 Non-Provisional application are hereby incorporated by reference.

TECHNICAL FIELD

The present disclosure relates to resistive memory cells, e.g., conductive bridging random access memory (CBRAM) or resistive random-access memory (ReRAM) cells, having a reduced area for the formation of conductive paths (e.g., conductive filaments or vacancy chains), and including a spacer region for further reducing the conductive path area and/or enhancing the electric field.

BACKGROUND

Resistive memory cells, such as conductive bridging memory (CBRAM) and resistive RAM (ReRAM) cells are a new type of non-volatile memory cells that provide scaling and cost advantages over conventional Flash memory cells. A CBRAM is based on the physical re-location of ions within a solid electrolyte. A CBRAM memory cell can be made of two solid metal electrodes, one relatively inert (e.g., tungsten) the other electrochemically active (e.g., silver or copper), with a thin film of the electrolyte between them. The fundamental idea of a CBRAM cell is to create programmable conducting filaments, formed by either single or very few nanometer-scale ions across a normally non-conducting film through the application of a bias voltage across the non-conducting film. The non-conducting film is referred to as the electrolyte since it creates the filament through an oxidation/reduction process much like in a battery. In a ReRAM cell the conduction is through creation of a vacancy chain in an insulator. The creation of the filament/vacancy-chain creates an on-state (high conduction between the electrodes), while the dissolution of the filament/vacancy-chain is by applying a similar polarity with Joule heating current or an opposite polarity but at smaller currents to revert the electrolyte/insulator back to its non-conductive off-state.

A wide range of materials have been demonstrated for possible use in resistive memory cells, both for the electrolyte and the electrodes. One example is the Cu/SiOx based cell in which the Cu is the active metal-source electrode and the SiOx is the electrolyte.

One common problem facing resistive memory cells is the on-state retention, i.e., the ability of the conductive path (filament or vacancy chain) to be stable, especially at the elevated temperatures that the memory parts would typically be qualified to (85 C/125 C).

FIG. 1 shows a conventional CBRAM cell IA, having a top electrode 10 (e.g., copper) arranged over a bottom electrode 12 (e.g., tungsten), with the electrolyte or middle electrode 14 (e.g., Si02) arranged between the top and bottom electrodes. Conductive filaments 18 propagate from the bottom electrode 12 to the top electrode 10 through the electrolyte 14 when a bias voltage is applied to the cell IA. This structure has various potential limitations or drawbacks. For example, the effective cross-sectional area for filament formation, referred to herein as the effective filament formation area indicated as App, or alternatively the "confinement zone," is relatively large and unconfined, making the filament formation area susceptible to extrinsic defects. Also, multi-filament root formation may be likely, due to a relatively large area, which may lead to weaker (less robust) filaments. In general, the larger the ratio between the diameter or width of the effective filament formation area App (indicated by "x") to the filament propagation distance from the bottom electrode 12 to the top electrode 10 (in this case, the thickness of the electrolyte 14, indicated by "y"), the greater the chance of multi-root filament formation. Further, a large electrolyte volume surrounds the filament, which provides diffusion paths for the filament and thus may provide poor retention. Thus, restricting the volume of the electrolyte material in which the conductive path forms may provide a more robust filament due to spatial confinement. The volume of the electrolyte material in which the conductive path forms may be restricted by reducing the area in contact between the bottom electrode 12 and the electrolyte 14.

As used herein, "conductive path" refers a conductive filament (e.g., in a CBRAM cell), vacancy chain (e.g., in an oxygen vacancy based ReRAM cell), or any other type of conductive path for connecting the bottom and top electrodes of a non-volatile memory cell (typically through an electrolyte layer or region arranged between the bottom and top electrodes).

As used herein the "electrolyte layer" or "electrolyte region" refers to an electrolyte/insulator/memory layer or region between the bottom and top electrodes through which the conductive path propagates.

FIG. 2 shows certain principles of a CBRAM cell formation. Conductive paths 18 may form and grow laterally, or branch into multiple parallel paths. Further, locations of the conductive paths may change with each program/erase cycle. This may contribute to a marginal switching performance, variability, high-temp retention issues, and/or switching endurance. Restricting switching volume has been shown to benefit the operation. These principles apply to ReRAM and CBRAM cells. A key obstacle for adoption of these technologies is switching uniformity.

FIGS. 3A and 3B show a schematic view and an electron microscope image of an example known bottom electrode configuration 1B for a CBRAM cell (e.g., having a one transistor, one-resistive memory element (1T1R) architecture). In this example, the bottom electrode 12 is a cylindrical via, e.g., a tungsten-filled via with a Ti/TiN liner. The bottom electrode 12 may provide a relatively large effective filament formation area App, or confinement zone, of about 30,000 $nm^2$, for example, which may lead to one or more of the problems or disadvantages discussed above.

SUMMARY

Some embodiments provide resistive memory cells, e.g., CBRAM or ReRAM cells, that focus the electric field more precisely than in known cells, which may provide more consistent filament formation, thus improving the consistency of programming voltage and cell predictability. For example, some embodiments provide methods for forming resistive memory cells (and formed memory cells/memory cell arrays) having a reduced area for the formation of conductive paths, which reduced conductive path area is defined by a path extending from a tip region (or regions) formed in the bottom electrode to a corresponding top electrode region, via an electrolyte region formed between the bottom electrode tip region and the top electrode.

Some embodiments include the feature of applying a thin spacer region, or "mini-spacer," to the cell structure between the bottom electrode and the electrolyte layer, on the lateral side or sides of the bottom electrode structure. The spacer region may be formed from an electrically insulating material, e.g., a dielectric, or any other suitable material. The insulating spacer may thus decrease the available or possible area for filament formation between the bottom electrode and top electrode via the electrolyte region. In some embodiments, the effective cross-sectional area, or "confinement zone," of the bottom electrode may be reduced in comparison to known resistive memory cells. For example, the confinement zone may be reduced to less than 1,000 $nm^2$, less than 100 $nm^2$, less than 10 $nm^2$, or even less than 1 $nm^2$. This may increase the restriction of filament formation to the tip of the bottom electrode, which may improve the device characteristics, and may provide an improvement over techniques that rely on enhanced electric field forces.

One embodiment provides a method of forming a resistive memory cell, including forming a bottom electrode layer on a substrate; oxidizing an exposed region of the bottom electrode layer to form an oxide region; removing a region of the bottom electrode layer proximate the oxide region, thereby forming a bottom electrode having a sidewall and a pointed tip region at a top of the sidewall adjacent the oxide region; depositing a spacer layer over at least the pointed tip region of the bottom electrode and the adjacent oxide region; removing a portion of the spacer layer such that a spacer region remains laterally adjacent the sidewall of the bottom electrode; and forming an electrolyte region and a top electrode over at least the spacer region, the pointed tip region of the bottom electrode, and the adjacent oxide region, such that the electrolyte region is arranged between the top electrode and the pointed tip region of the bottom electrode.

Another embodiment provides a method of forming an array of cells, including forming a bottom electrode layer on a substrate; oxidizing a plurality of exposed regions of the bottom electrode layer to form a plurality of oxide regions spaced apart from each other; removing regions of the bottom electrode layer between adjacent oxide regions, thereby forming a plurality of bottom electrodes, each bottom electrode having a sidewall and a respective oxide region at an upper side of the bottom electrode and at least one pointed tip region at a top of the sidewall adjacent the respective oxide region; depositing a spacer layer over the plurality of bottom electrodes and respective oxide regions; removing portions of the spacer layer such that a spacer region remains laterally adjacent the sidewall of each respective bottom electrode; forming an electrolyte layer and a top electrode layer over the plurality of bottom electrodes, spacer regions, and respective oxide regions; and removing portions of the electrolyte layer and a top electrode layer to form an electrolyte region and a top electrode on each bottom electrode and respective oxide region, thereby forming an array of cells, each cell including a respective bottom electrode, a respective oxide region, a respective electrolyte region, and a respective top electrode; wherein, for each cell: the respective electrolyte region is arranged between the pointed tip region of the respective bottom electrode and the respective top electrode, thereby providing a path for the formation of at least one conductive filament or vacancy chain from the pointed tip region of the respective bottom electrode to the respective top electrode through the respective electrolyte region; and the spacer region is located laterally between a portion of the bottom electrode sidewall below the tip region and a respective portion of the electrolyte region.

Another embodiment provides method of forming a resistive memory cell, including forming a bottom electrode layer on a substrate; oxidizing an exposed region of the bottom electrode layer to form an oxide region; removing a region of the bottom electrode layer proximate the oxide region, thereby forming a bottom electrode having a sidewall and a pointed tip region at a top of the sidewall adjacent the oxide region; depositing a spacer layer over at least the pointed tip region of the bottom electrode and the adjacent oxide region; removing a portion of the spacer layer such that a spacer region remains laterally adjacent the sidewall of the bottom electrode; and forming: (a) a first electrolyte region and first top electrode over a first portion of the pointed tip region of the bottom electrode and a corresponding first portion of the spacer region, such that the first electrolyte region is arranged between the first top electrode and the first portion of the pointed tip region of the bottom electrode to define a first memory element, and the first portion of the spacer region is located laterally between a first portion of the bottom electrode below the first portion of the pointed tip region and a respective portion of the first electrolyte region; and (b) a second electrolyte region and second top electrode over a second portion of the pointed tip region of the bottom electrode and a corresponding second portion of the spacer region, such that the second electrolyte region is arranged between the second top electrode and the second portion of the pointed tip region of the bottom electrode to define a second memory element, and the second portion of the spacer region is located laterally between a second portion of the bottom electrode below the second portion of the pointed tip region and a respective portion of second first electrolyte region.

Another embodiment provides a method of forming an array of memory elements, including forming a bottom electrode layer on a substrate; oxidizing a plurality of exposed regions of the bottom electrode layer to form a plurality of oxide regions spaced apart from each other; removing regions of the bottom electrode layer between adjacent oxide regions, thereby forming a plurality of bottom electrodes, each bottom electrode having a sidewall and a respective oxide region at an upper side of the bottom electrode and at least one pointed tip region at a top of the sidewall adjacent the respective oxide region; depositing a spacer layer over the plurality of bottom electrodes and respective oxide regions; removing portions of the spacer layer such that a spacer region remains laterally adjacent the sidewall of each respective bottom electrode; and for each bottom electrode, forming a pair of memory elements, each memory element defined by a respective region of the bottom electrode pointed tip, a respective top electrode, and an electrolyte region arranged therebetween, and a respective spacer region located laterally between a portion of the bottom electrode sidewall below the tip region and a respective portion of the electrolyte region.

Another embodiment provides an array of resistive memory structures, each including a bottom electrode formed on a substrate; an oxide region adjacent the bottom electrode; wherein the bottom electrode has a sidewall and a pointed tip region at a top of the sidewall proximate the oxide region; a dielectric spacer region laterally adjacent the bottom electrode sidewall; a first electrolyte region and first top electrode formed over a first portion of the pointed tip region of the bottom electrode and a corresponding first portion of the spacer region, with the first electrolyte region arranged between the first top electrode and the first portion of the pointed tip region of the bottom electrode to define a first memory element, and the first portion of the spacer region is located laterally between a first portion of the bottom electrode below the first portion of the pointed tip region and a respective portion of the first electrolyte region; and a second electrolyte region and second top electrode over a second portion of the pointed tip region of the bottom electrode and a corresponding second portion of the spacer region, with the second electrolyte region is arranged between the second top electrode and the second portion of the pointed tip region of the bottom electrode to define a second memory element, and the second portion of the spacer region is located laterally between a second portion of the bottom electrode below the second portion of the pointed tip region and a respective portion of second first electrolyte region.

BRIEF DESCRIPTION OF THE FIGURES

Example embodiments are discussed below with reference to the drawings, in

FIGS. 3A and 3B show a schematic view and an electron microscope image of an example known CBRAM cell configuration;

DETAILED DESCRIPTION

Figure 1:
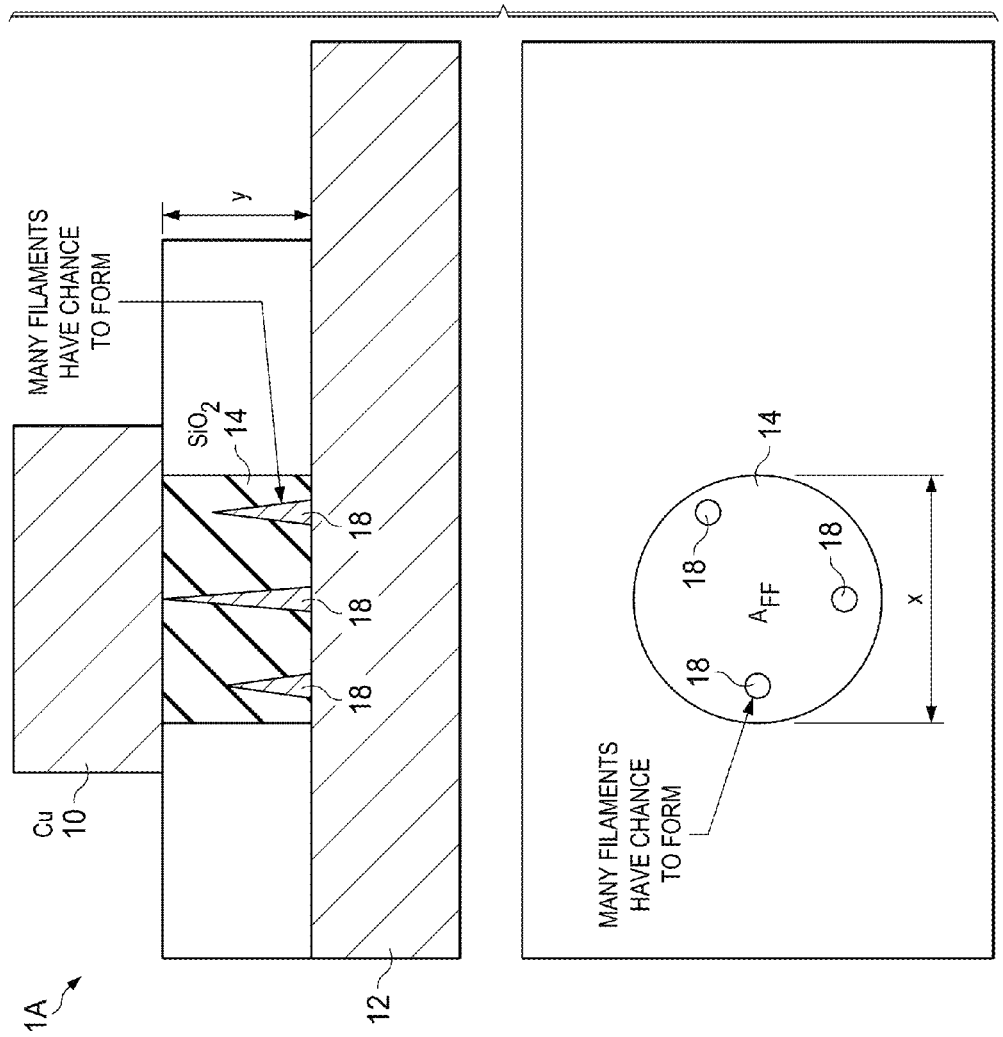
FIG. 1 shows an example conventional CBRAM cell.
Figure 2:
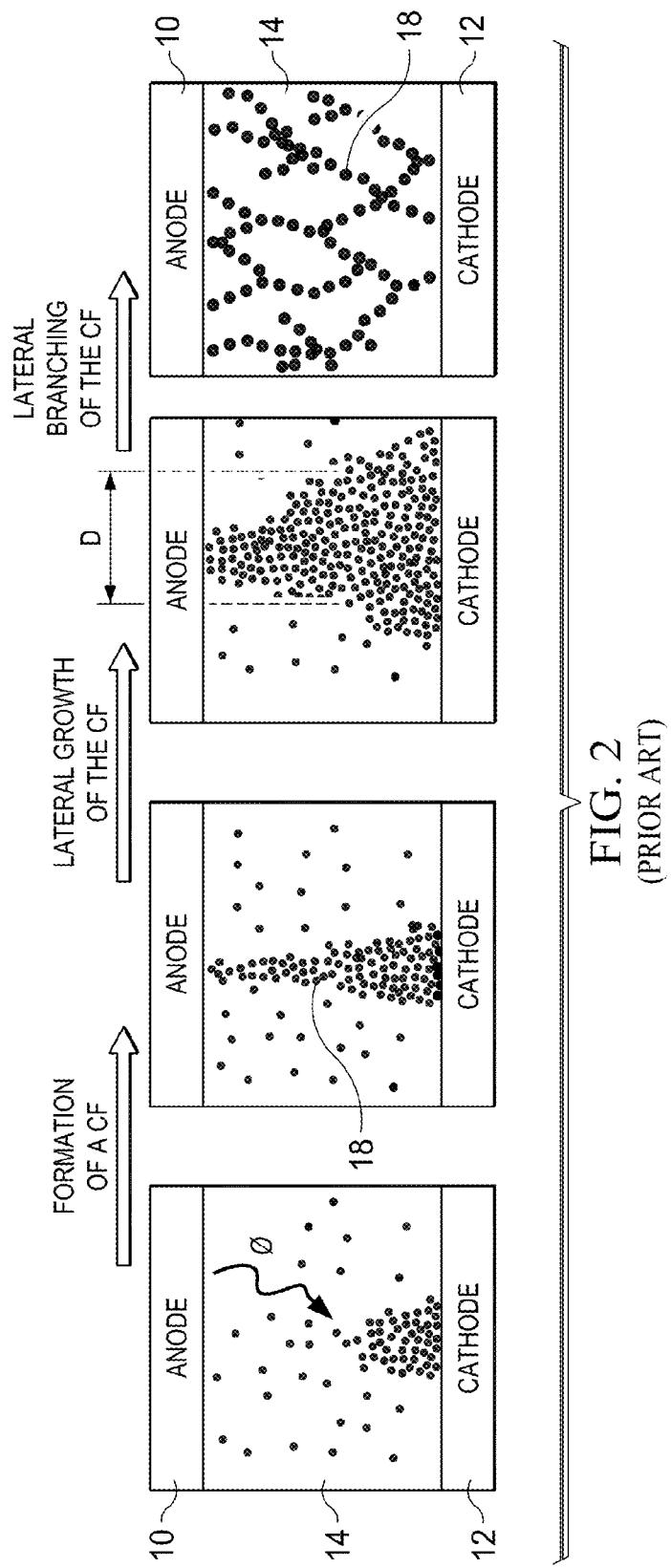
FIG. 2 shows certain principles of CBRAM cell formation.
Figure 4A:
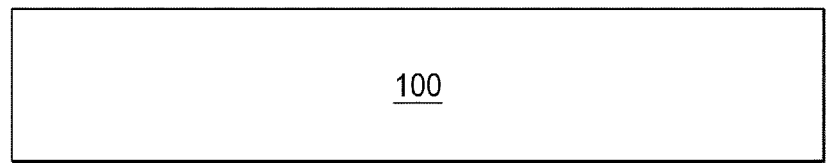
FIGS. 4A-4M illustrate an example method for forming an array of resistive memory cells, e.g., CBRAM or ReRAM cells, according to one embodiment of the present invention.
Figure 4B:
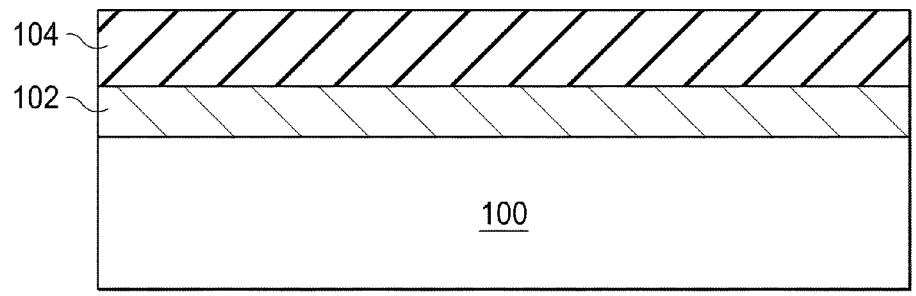

FIGS. 4A-4M illustrate an example method for forming an array of resistive memory cells, e.g., an array of conductive bridging memory (CBRAM) and resistive RAM (ReRAM) cells, according to one embodiment. As shown in FIG. 4A, a dielectric substrate 100 (e.g., SiO2) is formed, using any suitable technique. Next, as shown in FIG. 4B, a bottom electrode layer 102 and a hard mask layer 104 are deposited or formed over the dielectric substrate 100. Bottom electrode layer 102 may comprise any suitable conductive material or materials, e.g., polysilicon, doped polysilicon, amorphous silicon, doped amorphous silicon, or any other suitable material, and may be deposited or formed in any suitable manner. Hard mask layer 104 may be formed from any suitable materials (e.g., silicon nitride) and may be deposited or formed in any suitable manner as known in the art.

Figure 4C:
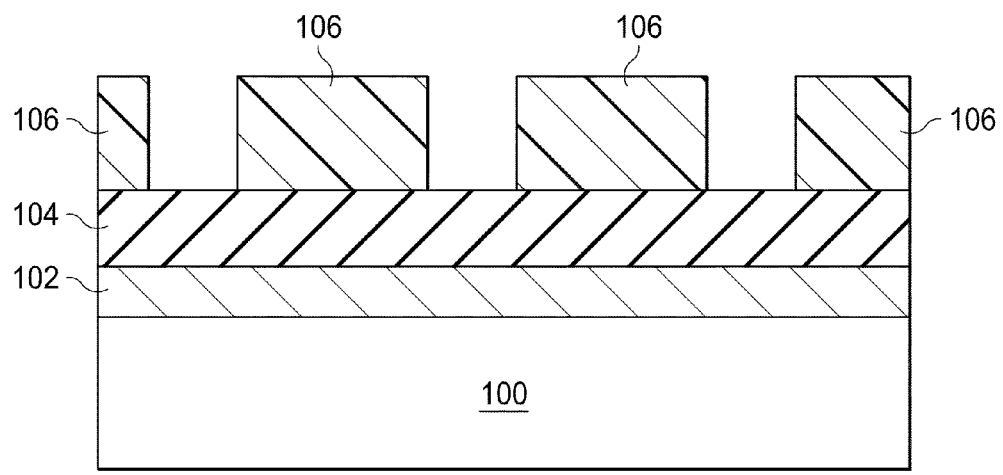

Next, as shown in FIG. 4C, the hard mask layer 104 is patterned, e.g., by forming and patterning a photoresist layer 106 over the hard mask layer 104, using any suitable photolithography techniques. As shown, certain areas of the hard mask layer 104 are exposed through the patterned photoresist layer 106. Next, as shown in FIG. 4D, an etching process is performed to remove the photoresist layer 106 and portions of the hard mask layer 104 corresponding to the exposed areas shown in FIG. 4C, thereby forming a patterned hard mask 104A having an array of openings 105.

Figure 4D:
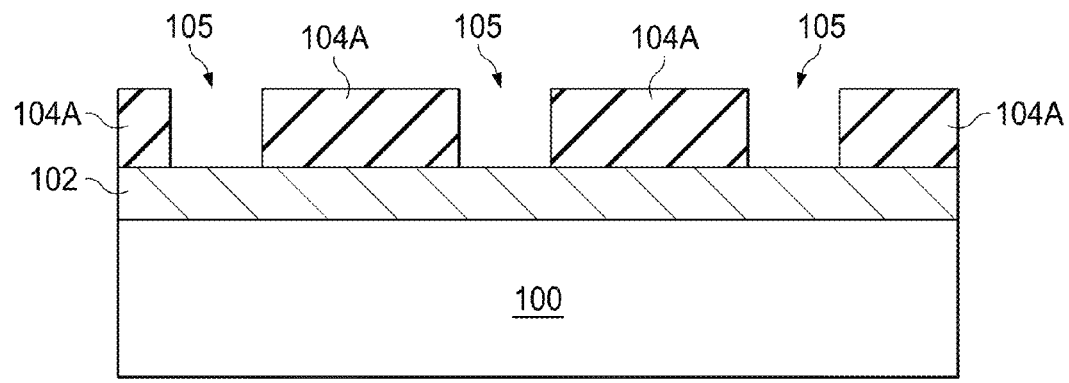

The patterning and etching processes of FIGS. 4C and 4D may be selected such that openings 105 have any desired size and shape. For example, openings 105 may have a circular or oval shaped cross-section (in a plane parallel to the bottom electrode layer 102), thus providing cylindrical or elongated cylindrical openings 105. As another example, openings 105 may have a rectangular or otherwise elongated cross-section (in a plane parallel to the bottom electrode layer 102), thus providing elongated trench-style openings 105. Openings 105 may have any other suitable shapes and sizes.

Figure 4E:
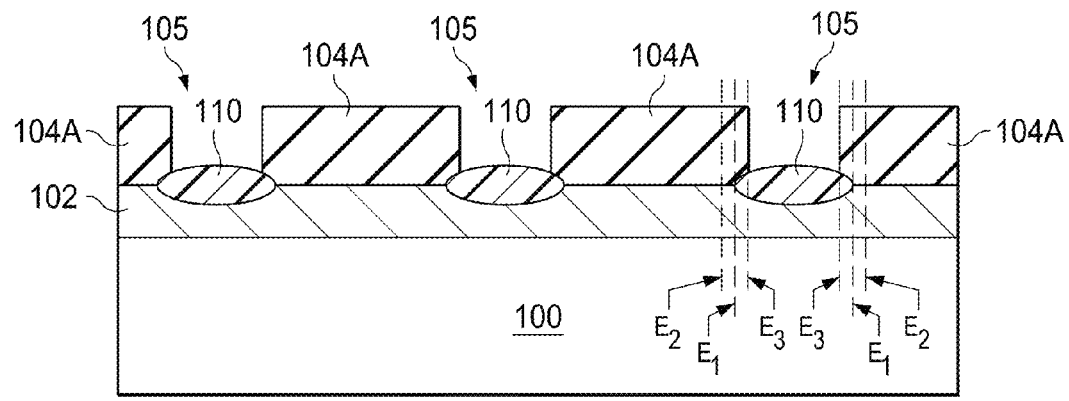

Next, as shown in FIG. 4E, an oxidation process is performed to oxidize areas of the bottom electrode layer 102 that are exposed through the openings 105 in patterned hard mask 104A, thereby forming a number of spaced-apart oxide regions 110. In some embodiments, each oxide region 110 may have a generally oval, rounded, curved, or otherwise non-orthogonal shape in a cross-section extending perpendicular to the bottom electrode layer 102 (i.e., the cross-section shown in FIG. 4E).

Figure 4F:
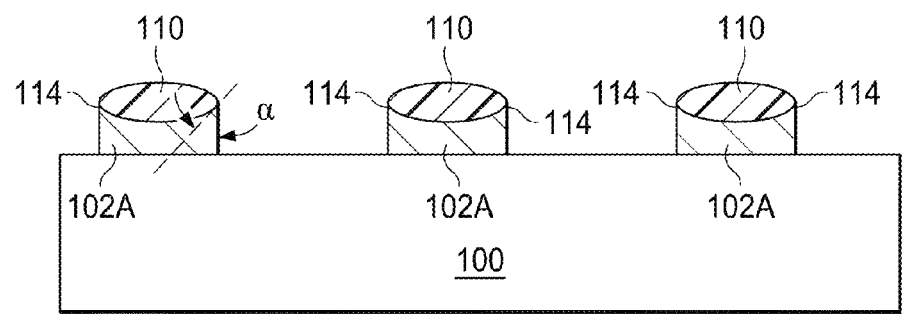

Next, as shown in FIG. 4F, the hard mask 104A is removed and the remaining bottom electrode layer 102 and oxide regions 110 are etched to form an array of spaced-apart bottom electrodes 102A and corresponding oxide regions 110. Alternatively, the hard mask 104A may be removed during the etching of the bottom electrodes 102A. The bottom electrode layer 102 and oxide regions 110 may be etched in any suitable manner, e.g., by applying and utilizing a patterned mask or photoresist above the stack, or by using the oxide regions 110 themselves as a mask (e.g., using an etch selective to the non-oxidized bottom electrode material). The etch may or may not be patterned to follow the pattern defined by openings 105 (and thus the pattern of oxide regions 110). Thus, bottom electrodes 102A may have any shape and size, which may or may not correspond with the shapes and sizes of the openings 105 and oxide regions 110 prior to the etch process. For example, bottom electrodes 102A may have a cylindrical or elongated cylindrical shape having a circular or oval shaped perimeter, or a rectangular prism shape have an elongated rectangular perimeter.

In addition, the lateral edges of the etch may be selected with respect to the lateral or outer perimeter edge or extent of each oxide region 110. For example, with reference to FIG. 4E, the lateral edges of the etch may align with the outer perimeter edge of each oxide region 110, as indicated by dashed lines E1. Alternatively, the lateral edges of the etch may be aligned outside the outer perimeter edge of each oxide region 110, as indicated by dashed lines E2, such that the post-etch bottom electrode 102A has a region laterally outside the outer perimeter edge of the oxide region 110. Alternatively, the lateral edges of the etch may be aligned inside the outer perimeter edge of each oxide region 110, as indicated by dashed lines E3, such that the etch extends removes an outer portion of the oxide region 110.

Returning to FIG. 4F, each bottom electrode 102A has a pointed tip region 114 adjacent the respective oxide region. The shape of the pointed tip region 114 may be at least partially defined by the oxide region 110. For example, where the vertical cross-section of the oxide region 110 is oval shaped or otherwise curves downwardly toward the substrate 100, the curved area toward the lateral perimeter of the oxide region 110 helps define the shape of the pointed tip region 114 of the bottom electrode 102A. Thus, in the vertical plane, the pointed tip region 114 may define an angle of less than 90 degrees, as shown in FIG. 4F.

The pointed tip region 114 may extend partially or fully around the lateral perimeter of the bottom electrode 102A (e.g., a circular, oval, or rectangular perimeter). In some embodiments, the lateral perimeter of the bottom electrode 102A defines a plurality of sides (e.g., a rectangular perimeter defining four sides), and the pointed tip region 114 extends along one, two, three, or more of the perimeter sides.

Figure 4G:
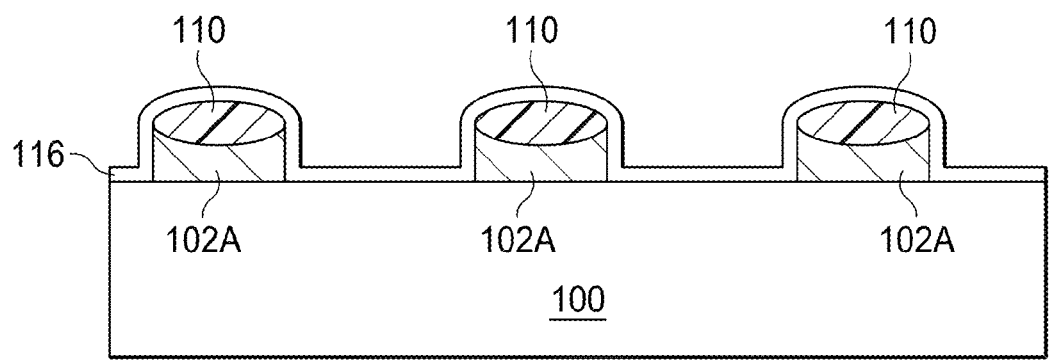

Next, as shown in FIG. 4G, a spacer layer 116 is deposited over the array of bottom electrodes 102A/oxide layers 110. Spacer layer 116 may comprise any electrically insulating material, e.g., a dielectric such as $SiO_x$ (e.g., $SiO_2$), GeS, CuS, $TaO_x$, $TiO_2$, $Ge_2Sb_2Te_5$, GdO, HfO, CuO, $Al_2O_3$, or any other suitable dielectric material. Spacer layer 116 may be formed or deposited in any suitable manner known to one of ordinary skill in the art.

Figure 4H:
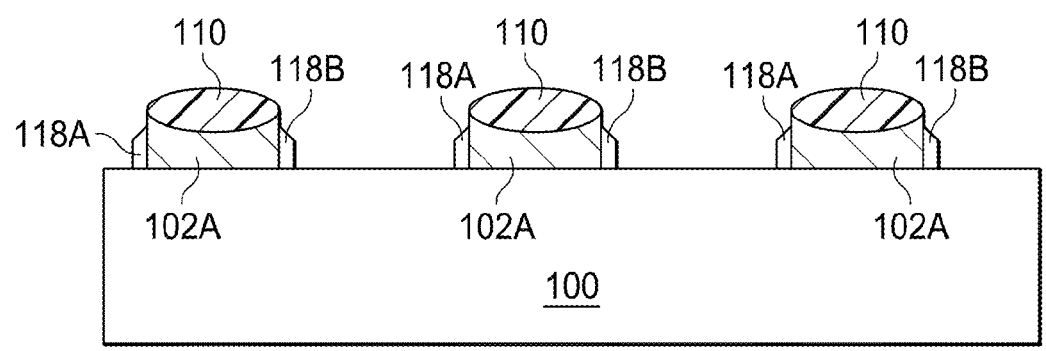

As shown in FIG. 4H, spacer layer 116 may be partially etched, using any suitable etch process known to one of ordinary skill in the art, to define at least one remaining spacer region 118 adjacent each bottom electrode 102A. The etch process may be selected or controlled such that the spacer region(s) 118 adjacent each bottom electrode 102A extends fully or partially around the perimeter of the bottom electrode 102A. Further, spacer layer 116 may be etched to define multiple spacer regions 118 at different locations around the perimeter of each bottom electrode 102A. The example shown in FIG. 4H includes a pair of spacer regions 118A and 118B adjacent each bottom electrode 102A. Further, the etch process may be selected or controlled such that each spacer region 118 extends only partially up the height of the adjacent edge of the bottom electrode 102A, as shown in FIG. 4H and more clearly shown in example FIG. 4M (discussed below).

Figure 4I:
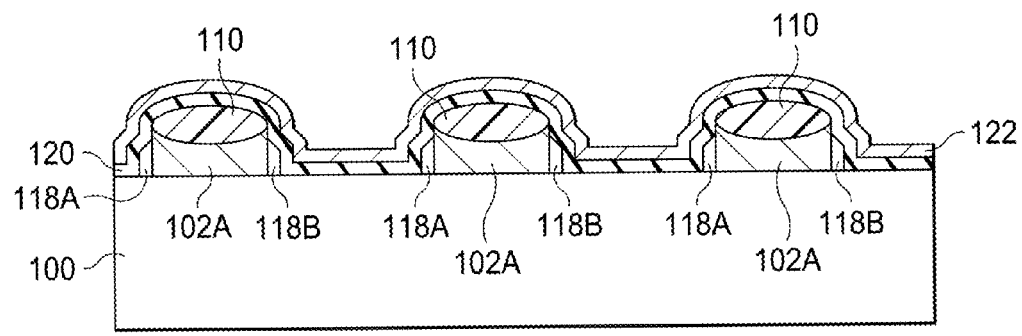

Next, as shown in FIG. 4I, an electrolyte layer 120 and a top electrode layer 122 are formed over the array of bottom electrode 102A and corresponding oxide regions 110. Electrolyte layer 120 may comprise any suitable dielectric or memristive type material or materials, for example, $SiO_x$ (e.g., $SiO_2$), GeS, CuS, $TaO_x$, $TiO_2$, $Ge_2Sb_2Te_5$, GdO, HfO, CuO, $Al_2O_3$, or any other suitable material. Top electrode layer 122 may comprise any suitable conductive material or materials, e.g., Ag, Al, Cu, Ta, TaN, Ti, TiN, Al, W or any other suitable material, and may be deposited or formed in any suitable manner.

Figure 4J:
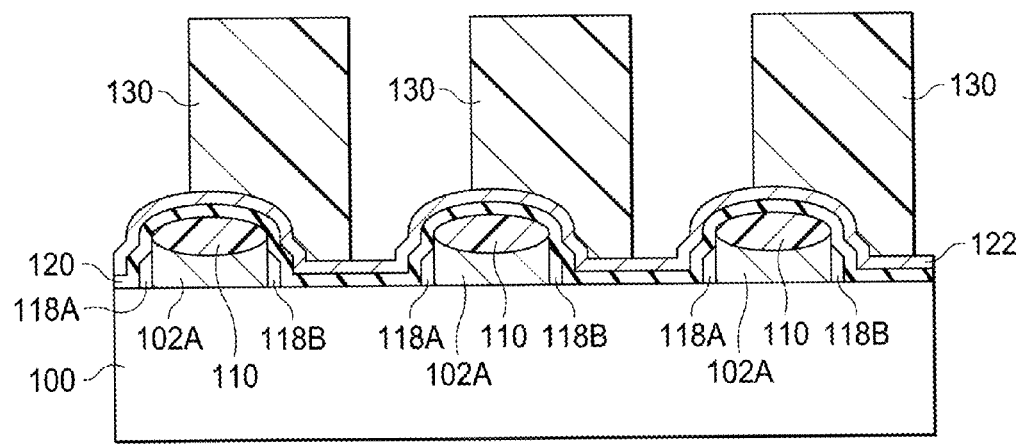

Next, as shown in FIG. 4J, the stack is patterned, e.g., by forming and patterning a photomask 130 over the top electrode layer 122, using any suitable photolithography techniques. As shown, certain areas of the top electrode layer 122 are exposed through the patterned photomask 130. In the illustrated embodiment, the patterned photoresist layer 130 covers only a portion of each underlying bottom electrode 102A/oxide region 110.

Figure 4K:
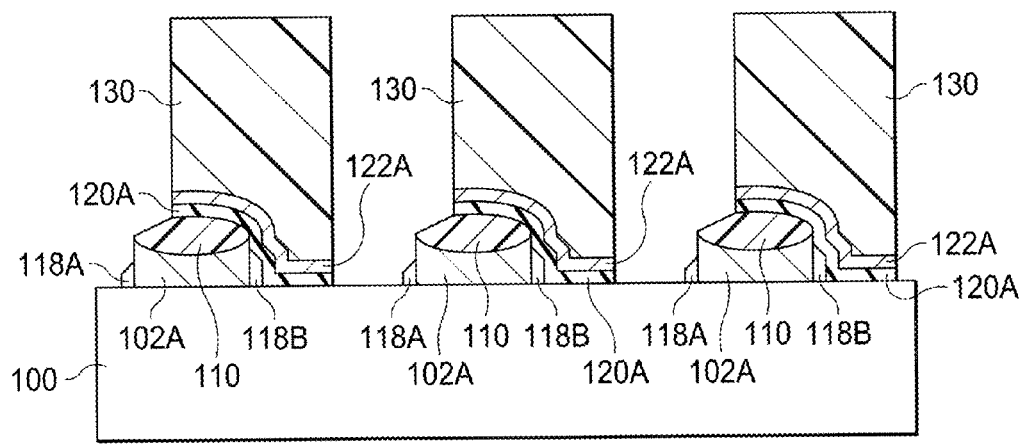

Next, as shown in FIG. 4K, an etching process is performed to remove exposed portions of the top electrode layer 122 and electrolyte layer 120. In some embodiments, the etch may be selective with respect to the oxide region 110 such that the oxide region 110 and underlying bottom electrode 102A are not removed, while exposing surfaces of the oxide region 110 and bottom electrode 102A. As shown, the remaining portions of the top electrode layer 122 and electrolyte layer 120 define a respective top electrode 122A and electrolyte region 120A for each bottom electrode 102A/oxide region 110 structure. Spacer regions 118 not covered by mask 130 may or may not be etched away, or may be partially etched away, depending on the particular type and extent of etching performed. In the illustrated example, each spacer region 118A is partially etched away.

Figure 4L:
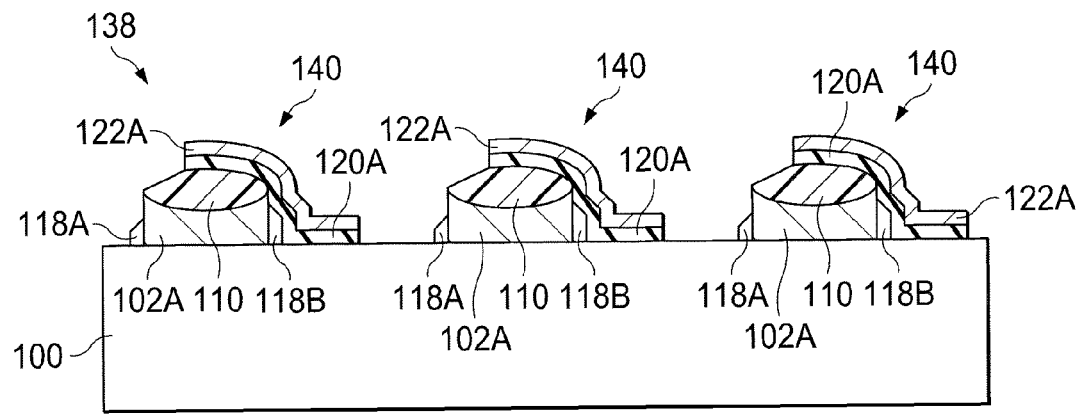

Next, as shown in FIG. 4L, any remaining portions of the photomask 130 may be removed, leaving an array 138 of resistive memory cells 140. Each cell 140 includes a bottom electrode 102A having an oxide region 110 at an upper surface, a top electrode 122A, and an electrolyte region 120A arranged between the bottom electrode 102A and top electrode 122A.

Figure 4M:
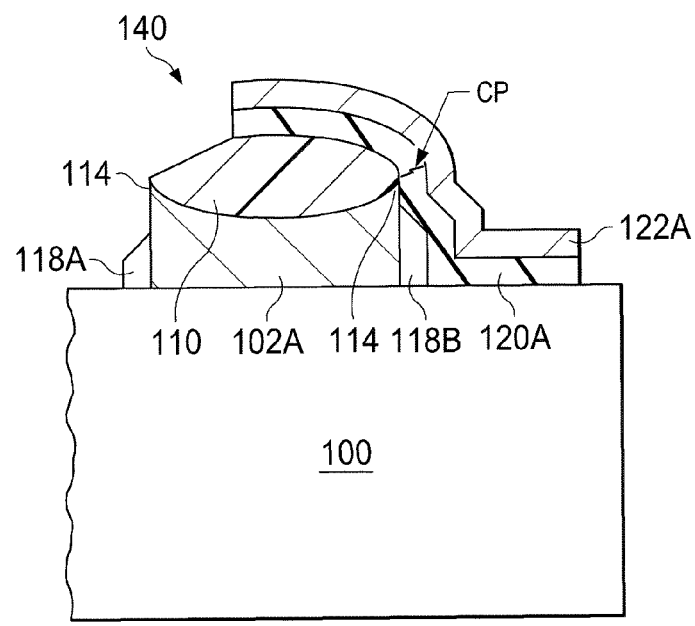

A close-up of one cell 140 is shown in FIG. 4M. As shown, the electrolyte region 120A is arranged between the pointed tip region 114 of the bottom electrode 102A and the top electrode 122A, which provides a conductive path for the formation of conductive filament(s) or vacancy chain(s) from the pointed tip region 114 of the bottom electrode 102A to the top electrode 122A through the electrolyte region 120A, said conductive path indicated by the illustrated dashed arrow CP.

FIG. 4M also shows the dielectric spacer regions 118B formed by the techniques discussed herein, arranged laterally between a sidewall of each bottom electrode 102A and a respective laterally-outward portion of the electrolyte region 120A. Thus, each spacer region 118B may decrease the available or possible area for filament formation between the sidewall of the bottom electrode 102A and the top electrode via the electrolyte (memory film), which may further restrict filament formation to the bottom electrode tip 114. As shown, in some embodiment, each spacer region 118B extends only partially up the height of the bottom electrode sidewall, such that a path from the bottom electrode tip 114 to the top electrode 122A via the electrolyte 120A is defined that is free of the spacer region 118B. In some embodiments, the height of each spacer region 118B is greater than 50% but less than 100% of the height of the adjacent edge of the bottom electrode 102A. In particular embodiments, the height of each spacer region 118B is greater than 75% but less than 100% of the height of the adjacent edge of the respective bottom electrode 102A. Thus, the top of the remaining spacer region 118B may be located below the pointed tip 114 of the bottom electrode 102A.

Thus, the structure of cells 140, including the pointed tip region 114 and dielectric spacer region 118B, may define a relatively small, or confined, effective filament formation area $A_{FF}$, or confinement zone. For example, the effective filament formation area $A_{FF}$, measured in a plane generally perpendicular to the direction of filament propagation, may be less than 1,000 nm². In some embodiments, the effective filament formation area $A_{FF}$ is less than 100 nm². In particular embodiments, the effective filament formation area $A_{FF}$ is less than 10 nm², or even less than 1 nm². This reduced confinement zone may provide resistive memory cells (e.g., CBRAM or ReRAM cells) with more predictable and reliable filament formation, as compared with cells having a larger confinement zone. This may provide one or more of the following benefits: lower erase current, narrower distribution of low-resistance state (LRS), higher on/off ratio (HRS/LRS), and improved failure rates.

Figure 5A:
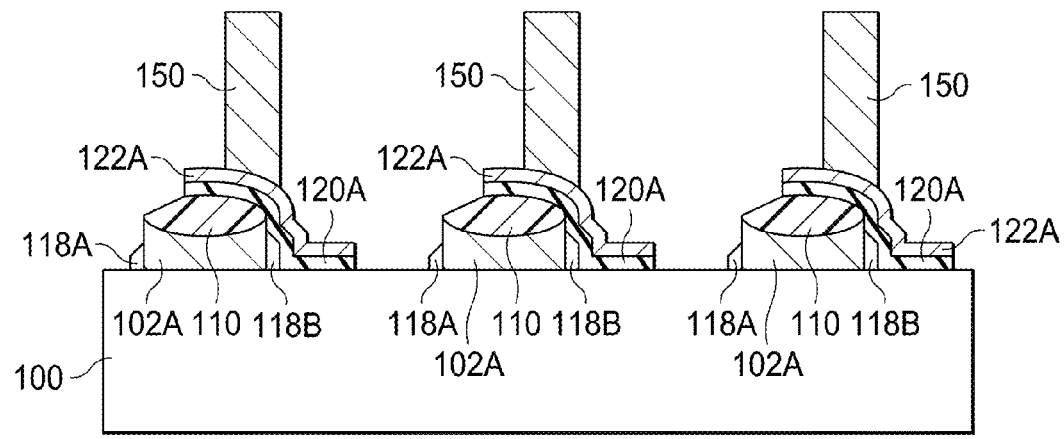
FIG. 5A illustrates a first example top electrode contact configuration, according to one embodiment.
Figure 5B:
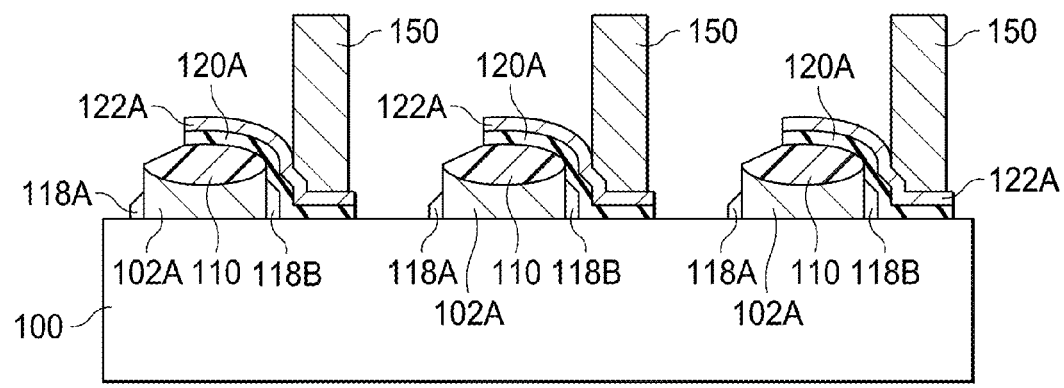
FIG. 5B illustrates a second example top electrode contact configuration, according to another embodiment.

Top electrodes 122A may be connected in or to any suitable circuitry using any suitable contact scheme. For example, FIGS. 5A and 5B illustrate two example schemes for contacting top electrodes 122A. First, as shown in FIG. 5A, top contacts 150 may be formed such that they contact an upper portion of each top electrode 122A, above the respective bottom electrode 102A/oxide region 110. Second, as shown in FIG. 5B, top contacts 150 may be formed such that they contact a lower portion of each top electrode 122A at a location lateral to the respective bottom electrode 102A/oxide region 110. Top contacts 150 may be arranged in any other suitable manner with respect to top electrodes 122A and other cell components.

In addition, it should be understood that each bottom electrode 102A may be contacted (e.g., for connection to a wordline or bitline) in any suitable or conventional manner. For example, each bottom electrode 102A may be contacted from above by dropping down a contact that is recessed or offset from the memory films. As another example, each bottom electrode 102A may be contacted from below by depositing the bottom electrode layer 102 directly on a salicided active silicon region and then making contact to the active region at the end of a line of bits.

Figure 6A:
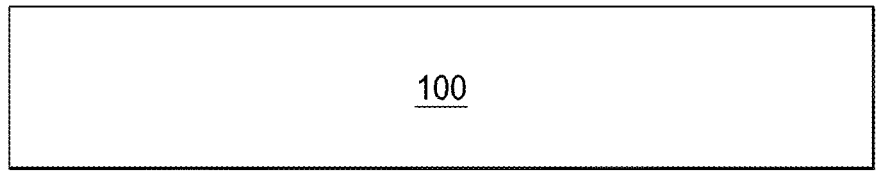
FIGS. 6A-6O illustrate another example method for forming an array of resistive memory cells, e.g., CBRAM or ReRAM cells, according to one embodiment of the present invention.
Figure 6B:
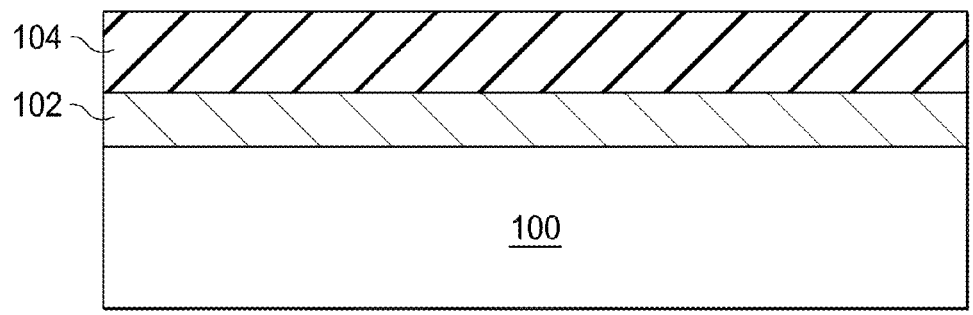
Figure 6C:
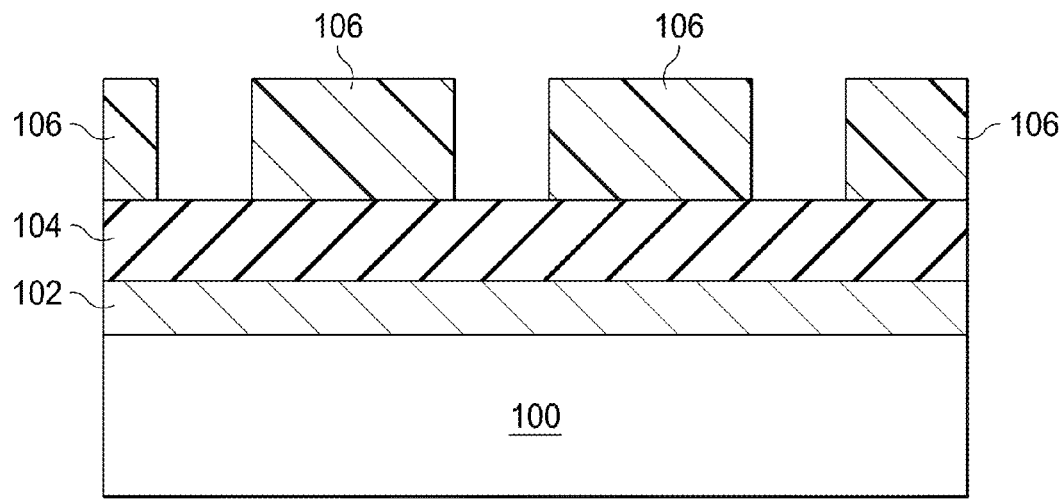
Figure 6D:
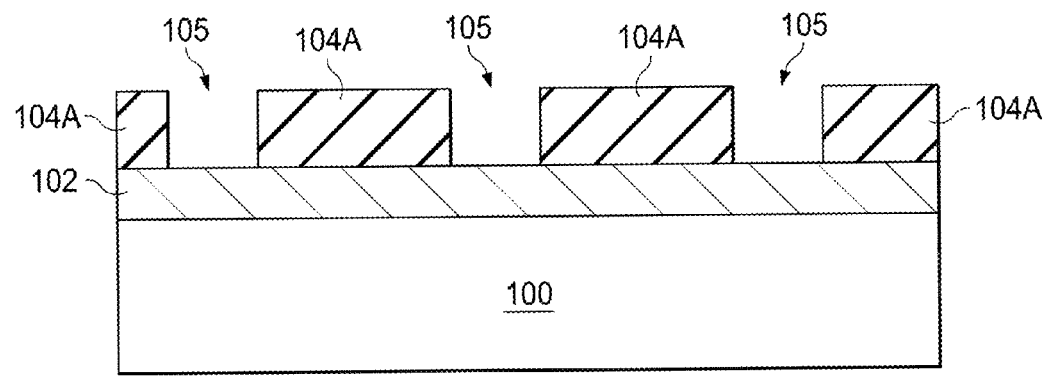
Figure 6E:
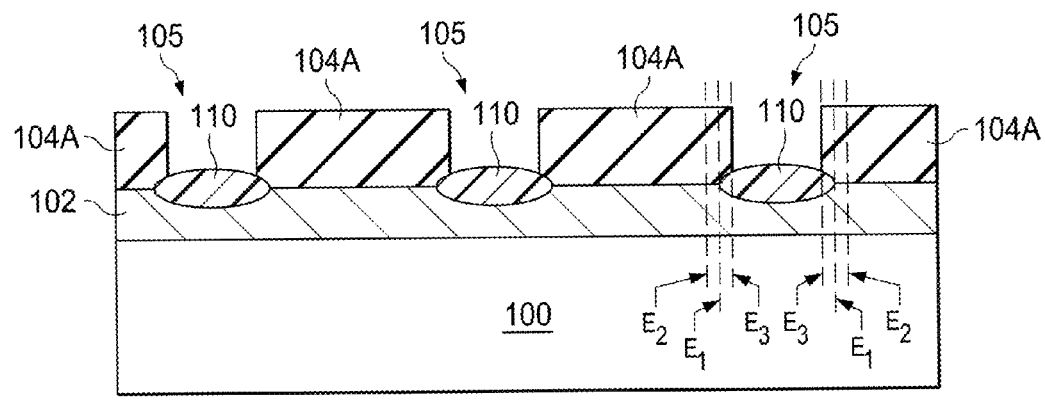
Figure 6F:
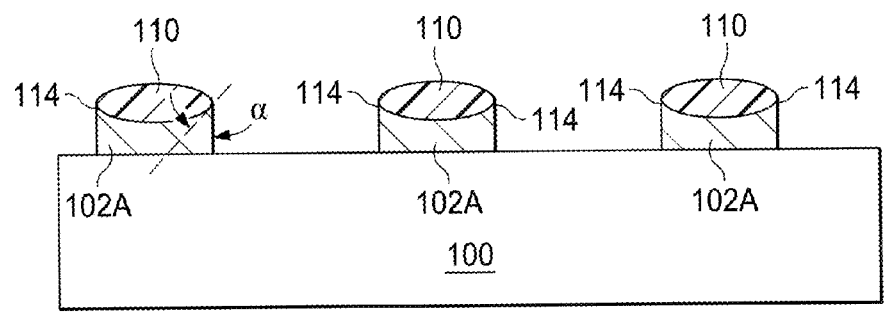
Figure 6G:
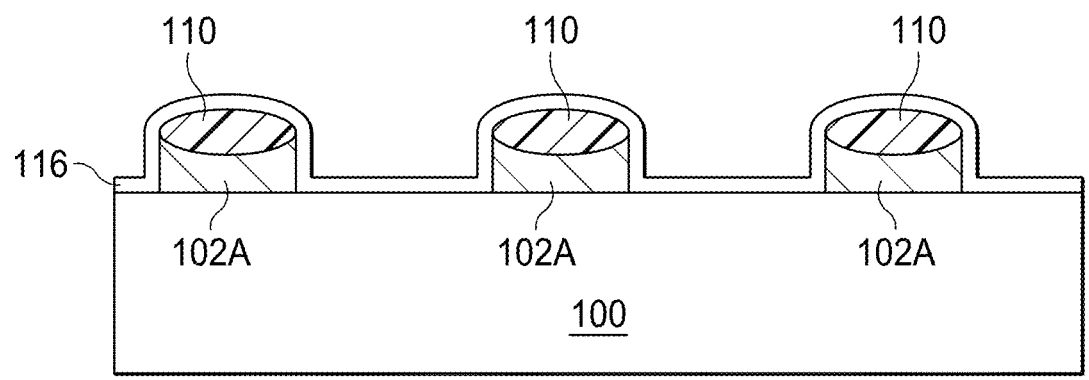
Figure 6H:
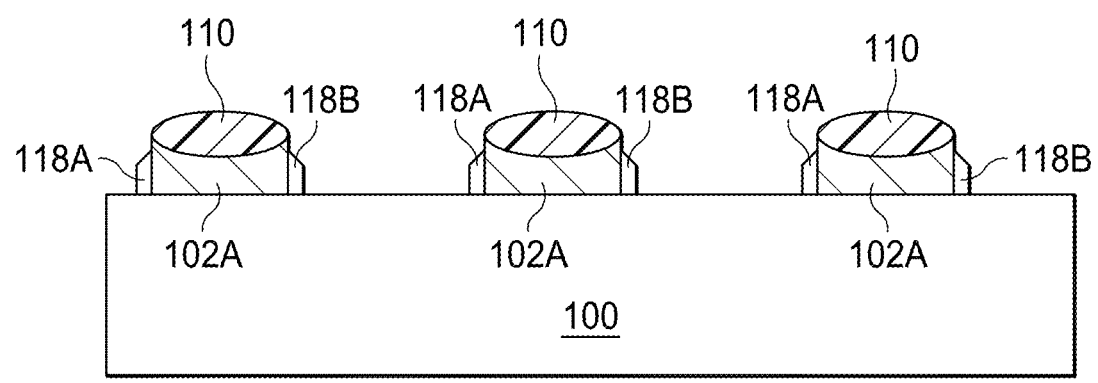
Figure 6I:
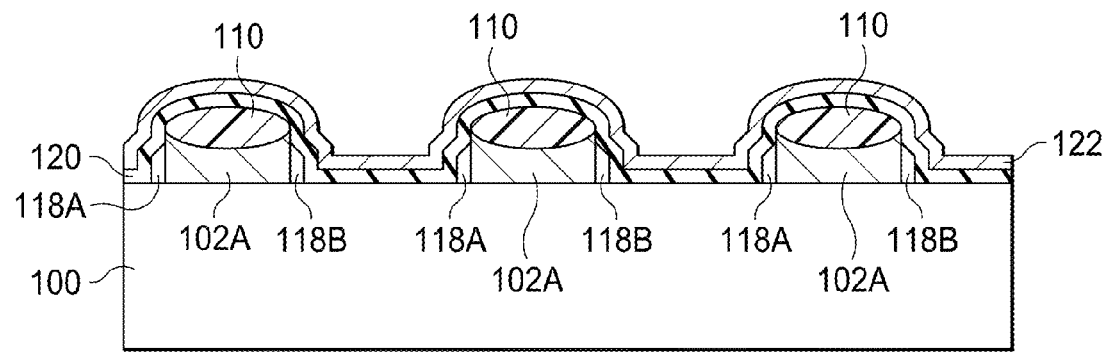
Figure 6J:
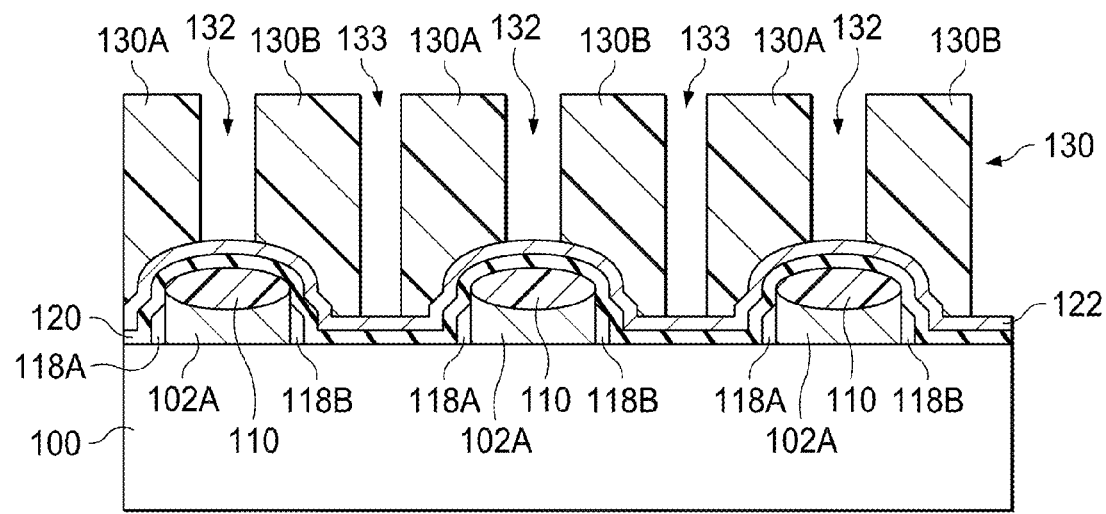
Figure 6K:
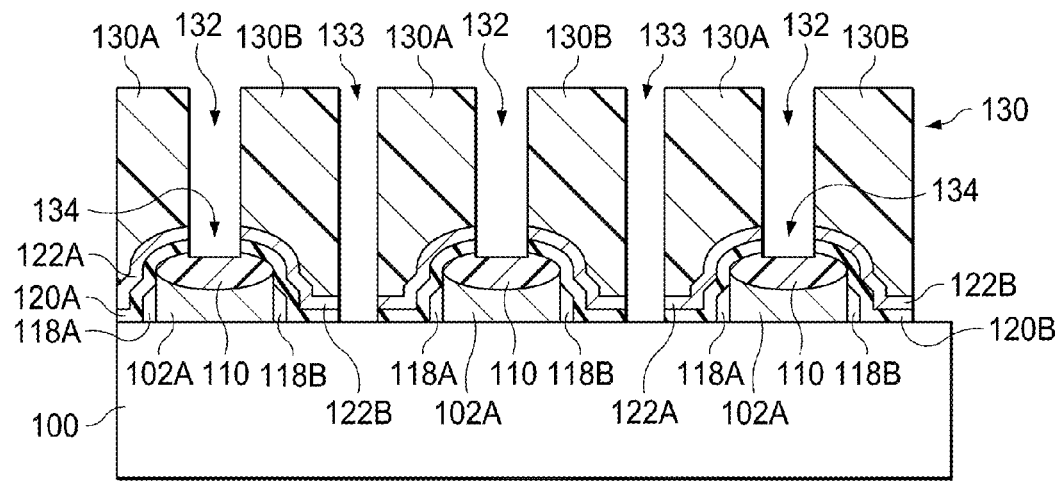
Figure 6L:
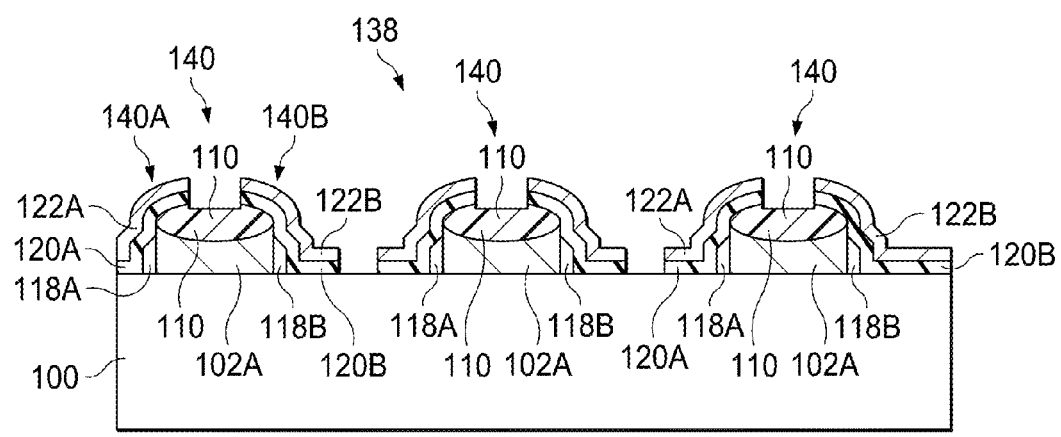
Figure 6M:
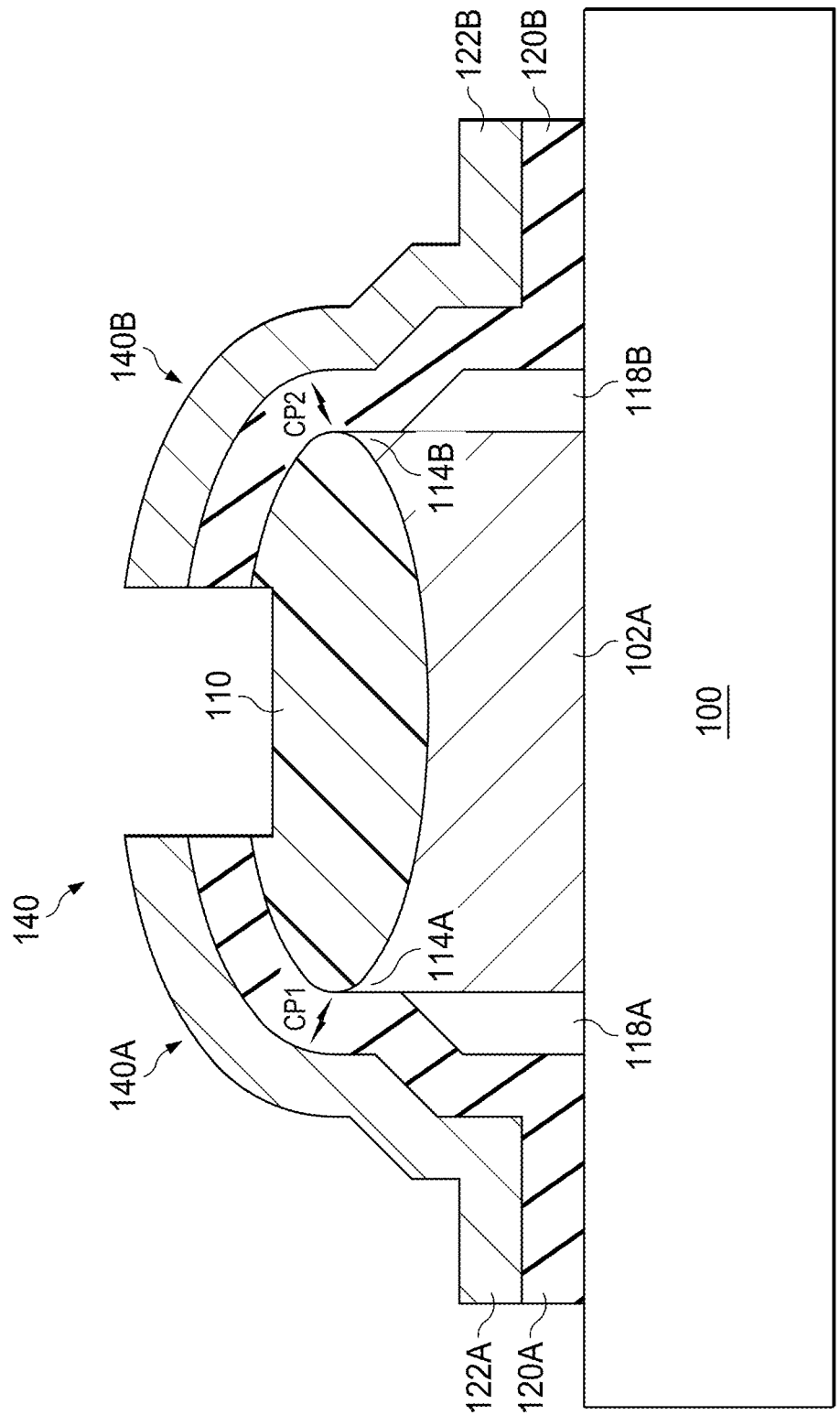
Figure 6N:
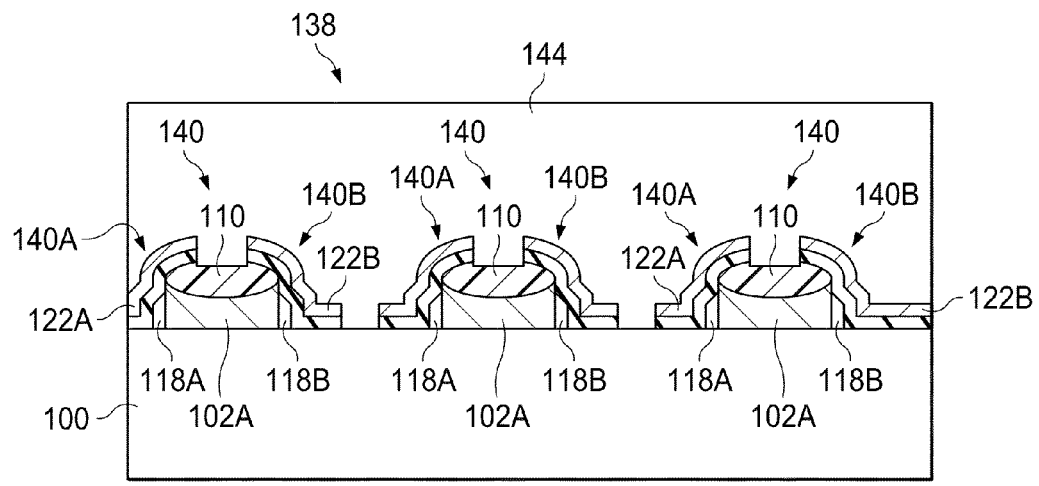
Figure 6O:
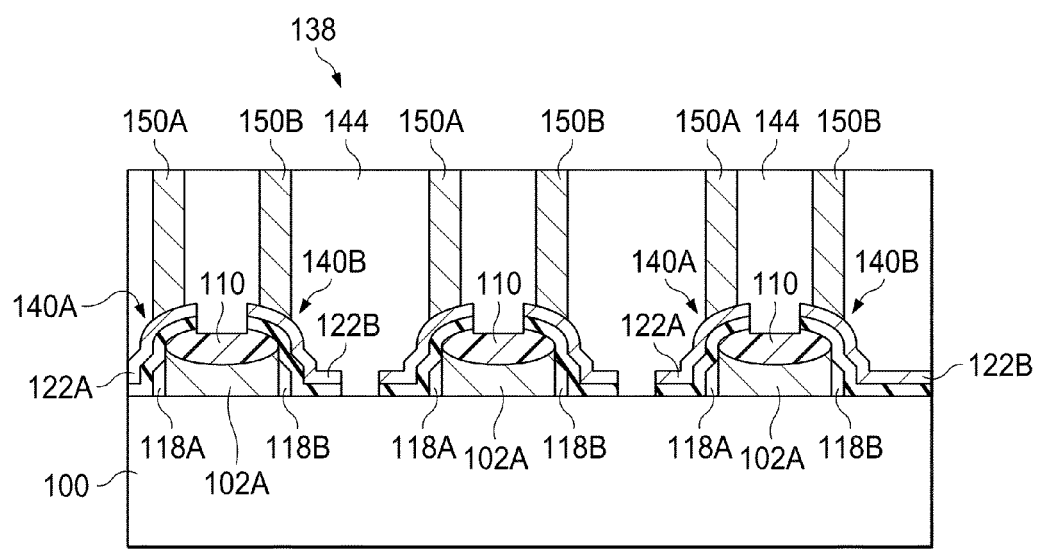

FIGS. 6A-6O illustrate another example method for forming an array of resistive memory cells, e.g., an array of conductive bridging memory (CBRAM) and resistive RAM (ReRAM) cells, according to another embodiment. The method of FIGS. 6A-6O may be generally similar to the method of FIGS. 4A-4M, but may include forming a pair of bottom electrode pointed tip region 114 in each cell, with a corresponding pair of mini-spacer regions 118A and 118B in each cell.

The steps shown in FIGS. 6A-6G may be similar or identical to the steps shown in FIGS. 4A-4G discussed above, to form a structure including a spacer layer 116 formed over an array of bottom electrodes 102A/oxide regions 110. After this point, the method may differ from that of FIGS. 4A-4G, as discussed below.

As shown in FIG. 6H, the spacer layer 116 may be partially etched, using any suitable etch process known to one of ordinary skill in the art, to define a pair of spaced-apart spacer regions 118A and 118B adjacent each bottom electrode 102A. For example, the pair of spacer regions 118A and 118B may be located on opposite sides of each bottom electrode 102A. The etch process may be selected or controlled such that each spacer region 118 extends only partially up the height of the adjacent edge of the bottom electrode 102A, as shown in FIG. 6H and more clearly shown in example FIG. 6M (discussed below).

Next, as shown in FIG. 6I, an electrolyte layer 120 and a top electrode layer 122 are formed over the array of bottom electrode 102A and corresponding oxide regions 110. Electrolyte layer 120 may comprise any suitable dielectric or memristive type material or materials, for example, $SiO_x$ (e.g., $SiO_2$), GeS, CuS, $TaO_x$, $TiO_2$, $Ge_2Sb_2Te_5$, GdO, HfO, CuO, $Al_2O_3$, or any other suitable material. Top electrode layer 122 may comprise any suitable conductive material or materials, e.g., Ag, Al, Cu, Ta, TaN, Ti, TiN, Al, W or any other suitable material, and may be deposited or formed in any suitable manner.

Next, as shown in FIG. 6J, the stack is patterned, e.g., by forming and patterning a photomask 130 over the top electrode layer 122, using any suitable photolithography techniques. As shown, photomask 130 may be patterned in a manner that defines a pair of photomask regions 130A and 130B separated by a gap 132 over each cell structure, with a central area of each cell structure being exposed through each gap 132. Further, the pair of photomask regions 130A and 130B over each cell structure is separated from the adjacent pair of photomask regions 130A and 130B by a gap 133.

Next, as shown in FIG. 6K, an etching process is performed through gaps 132 and 133 to remove exposed portions of the top electrode layer 122 and underlying portions of electrolyte layer 120. In some embodiments, the etch may be selective with respect to the oxide region 110 such that the oxide region 110 and underlying bottom electrode 102A are not removed, while exposing surfaces of the oxide region 110 and bottom electrode 102A. As shown, etching through gaps 133 removes portions of top electrode layer 122 and electrolyte layer 120 between adjacent bottom electrodes 102A to separate adjacent cell structures from each other. In addition, etching through gaps 132 removes portions of top electrode layer 122 and electrolyte layer 120 over a central area of each oxide region 110/bottom electrode 102A, thereby defining, over each oxide region 110/bottom electrode 102A, a first top electrode 122A and first electrolyte region 120A physically separated from a second top electrode 122B and second electrolyte region 120B. As discussed below in more detail with respect to FIG. 6M, the first top electrode 122A is arranged to interact with a first region of the bottom electrode 102A (via the first electrolyte region 120A) to define a first memory element 140A (indicated in FIGS. 6L and 6M), while the second top electrode 122B is arranged to interact with a second region of the bottom electrode 102A (via the second electrolyte region 120B) to define a second memory element 140B (indicated in FIGS. 6L and 6M). Thus, the etch process forms two distinct memory elements 140A and 140B for each bottom electrode 102A. This may therefore double the density of memory cells as compared to a design in which a single memory element is formed per bottom electrode.

Next, as shown in FIG. 6L, any remaining portions of the photomask 130 may be removed, leaving an array 138 of resistive memory cell structures 140, in which each memory cell structure 140 defines a pair of memory elements 140A and 140B, as discussed above.

A close-up of one memory cell structure 140 is shown in FIG. 6M. As shown, the memory cell structure 140 defines a pair of memory elements 140A and 140B. The first memory element 140A is defined by a first top electrode 122A, a first portion 114A of the pointed tip region 114 of bottom electrode 102A, and a first electrolyte region 120A arranged therebetween. Similarly, the second memory element 140B is defined by a second top electrode 122B, a second portion 114B of the pointed tip region 114 of bottom electrode 102A, and a second electrolyte region 120B arranged therebetween. In this embodiment, memory element 140A is a mirror image of corresponding memory element 140B. In other embodiments, memory element 140A may have a different shape or structure than its corresponding memory element 140B, e.g., by shifting the etch opening 132 (see FIG. 6K for reference) from the center of the respective underlying bottom electrode 102A, or by forming an irregular-shaped etch opening 132, for example.

The first memory element 140A provides a first conductive path CP1 for the formation of conductive filament(s) or vacancy chain(s) from the first pointed tip region 114A of the bottom electrode 102A to the top electrode 122A through the electrolyte region 120A. Similarly, the second memory element 140B provides a second conductive path CP2 for the formation of conductive filament(s) or vacancy chain(s) from the second pointed tip region 114B of the bottom electrode 102A to the top electrode 122B through the electrolyte region 120B.

FIG. 6M also shows the dielectric spacer regions 118A and 118B formed by the techniques discussed herein, with dielectric spacer regions 118A arranged laterally between a sidewall of bottom electrode 102A and the laterally-outward first electrolyte region 120A, and dielectric spacer regions 118A arranged laterally between a sidewall of bottom electrode 102A and the laterally-outward second electrolyte region 120B. Thus, each spacer region 118 may decrease the available or possible area for filament formation between the bottom electrode 102A and the respective top electrode 122A, 122B via the respective electrolyte (memory film) 120A, 120B, which may further restrict filament formation to the respective bottom electrode tip 114. As shown, in some embodiment, each spacer region 118A, 118B extends only partially up the height of the adjacent bottom electrode sidewall, such that a path from the respective bottom electrode tip 114A, 114B to the respective top electrode 122A, 122B via the respective electrolyte 120A, 120B is defined that is free of the respective spacer region 118A, 118B. In some embodiments, the height of each spacer region 118A, 118B is greater than 50% but less than 100% of the height of the adjacent edge of the bottom electrode 102A. In particular embodiments, the height of each spacer region 118A, 118B is greater than 75% but less than 100% of the height of the adjacent edge of the bottom electrode 102A. Thus, the top of each spacer region 118A, 118B may be located below the respective pointed tip 114A, 114B of the bottom electrode 102A.

Thus, the structure of each memory element 140A and 140B, including the respective pointed tip region 114A or 114B and corresponding mini-spacer region 118A or 118B, may define a relatively small, or confined, effective filament formation area $A_{FF}$, or confinement zone. For example, the effective filament formation area $A_{FF}$ for each memory element 140A/140B, measured in a plane generally perpendicular to the direction of filament propagation, may be less than 1,000 nm$^2$. In some embodiments, each effective filament formation area $A_{FF}$ is less than 100 nm$^2$. In particular embodiments, each effective filament formation area $A_{FF}$ is less than 10 nm$^2$, or even less than 1 nm$^2$. These reduced confinement zones may provide resistive memory cells (e.g., CBRAM or ReRAM cells) with more predictable and reliable filament formation, as compared with cells having a larger confinement zone. This may provide one or more of the following benefits: lower erase current, narrower distribution of low-resistance state (LRS), higher on/off ratio (HRS/LRS), and improved failure rates.

Top electrodes 122A and 122B may be connected in or to any suitable circuitry using any suitable contact scheme. For example, top contacts may be formed in contact with top electrodes 122A and 122B as shown in FIGS. 6N and 6O. First, as shown in FIG. 6N, a dielectric layer 144 may be deposited over the array of memory elements 140A and 140B. Then, as shown in FIG. 6O, top contacts 150A and 150B may be formed in dielectric layer 144, using any suitable techniques. As shown, each top contact 150A contacts an upper portion of a top electrode 122A, while each top contact 150B contacts an upper portion of a top electrode 122B. Top contacts 150 may be arranged in any other suitable manner with respect to top electrodes 122A and 122B and other cell components.

In addition, it should be understood that each bottom electrode 102A may be contacted (e.g., for connection to a wordline or bitline) in any suitable or conventional manner. For example, each bottom electrode 102A may be contacted from above by dropping down a contact that is recessed or offset from the memory films. As another example, each bottom electrode 102A may be contacted from below by depositing the bottom electrode layer 102 directly on a salicided active silicon region and then making contact to the active region at the end of a line of bits.

Although the disclosed embodiments are described in detail in the present disclosure, it should be understood that various changes, substitutions and alterations can be made to the embodiments without departing from their spirit and scope.

The invention claimed is:

1. A method of forming a resistive memory cell, comprising:
   forming a bottom electrode layer on a substrate;
   oxidizing an exposed region of the bottom electrode layer to form an oxide region;
   removing a region of the bottom electrode layer proximate the oxide region, thereby forming a bottom electrode having a sidewall and a pointed tip region at a top of the sidewall adjacent the oxide region;
   depositing a spacer layer over at least the pointed tip region of the bottom electrode and the adjacent oxide region;
   removing a portion of the spacer layer such that a spacer region remains laterally adjacent the sidewall of the bottom electrode;
   forming an electrolyte region and a top electrode over at least the spacer region, the pointed tip region of the bottom electrode, and the adjacent oxide region, such that the electrolyte region is arranged between the top electrode and the pointed tip region of the bottom electrode.

2. The method according to claim 1, wherein a direct path between the pointed tip region of the bottom electrode and the top electrode via the electrolyte region is free of the spacer region.

3. The method according to claim 1, wherein the spacer region is located laterally between the sidewall of the bottom electrode layer and the electrolyte region.

4. The method according to claim 1, wherein removing a portion of the spacer layer comprises removing a portion of the spacer layer such that the remaining spacer region extends only partially up a height of the bottom electrode sidewall.

5. The method according to claim 1, wherein removing a portion of the spacer layer comprises removing a portion of the spacer layer such that the top of the remaining spacer region is located below the pointed tip of the bottom electrode.

6. The method according to claim 1, wherein the spacer layer comprises a dielectric material.

7. The method according to claim 1, wherein the resistive memory cell is a conductive bridging memory (CBRAM) cell or a resistive RAM (ReRAM) cell.

8. The method according to claim 1, wherein the electrolyte region provides a path for the formation of a conductive filament or vacancy chain from the pointed tip region of the bottom electrode to the top electrode.

9. The method according to claim 1, wherein a cross-section of each oxide region in a plane perpendicular to the bottom electrode layer has a generally oval shape.

10. The method according to claim 1, wherein a shape of the pointed tip region of the bottom electrode is defined by the oxide region.

11. A method of forming an array of cells, comprising:
    forming a bottom electrode layer on a substrate;
    oxidizing a plurality of exposed regions of the bottom electrode layer to form a plurality of oxide regions spaced apart from each other;
    removing regions of the bottom electrode layer between adjacent oxide regions, thereby forming a plurality of bottom electrodes, each bottom electrode having a sidewall and a respective oxide region at an upper side of the bottom electrode and at least one pointed tip region at a top of the sidewall adjacent the respective oxide region;

depositing a spacer layer over the plurality of bottom electrodes and respective oxide regions;

removing portions of the spacer layer such that a spacer region remains laterally adjacent the sidewall of each respective bottom electrode;

forming an electrolyte layer and a top electrode layer over the plurality of bottom electrodes, spacer regions, and respective oxide regions;

removing portions of the electrolyte layer and a top electrode layer to form an electrolyte region and a top electrode on each bottom electrode and respective oxide region, thereby forming an array of cells, each cell including a respective bottom electrode, a respective oxide region, a respective electrolyte region, and a respective top electrode;

wherein, for each cell:
the respective electrolyte region is arranged between the pointed tip region of the respective bottom electrode and the respective top electrode, thereby providing a path for the formation of at least one conductive filament or vacancy chain from the pointed tip region of the respective bottom electrode to the respective top electrode through the respective electrolyte region; and the spacer region is located laterally between a portion of the bottom electrode sidewall below the tip region and a respective portion of the electrolyte region.

12. The method according to claim 11, wherein a direct path between the pointed tip region of the bottom electrode and the top electrode via the electrolyte region is free of the spacer region.

13. The method according to claim 11, wherein removing each spacer region extends only partially up a height of the respective bottom electrode sidewall.

14. A method of forming a resistive memory cell, comprising:
forming a bottom electrode layer on a substrate;
oxidizing an exposed region of the bottom electrode layer to form an oxide region;
removing a region of the bottom electrode layer proximate the oxide region, thereby forming a bottom electrode having a sidewall and a pointed tip region at a top of the sidewall adjacent the oxide region;
depositing a spacer layer over at least the pointed tip region of the bottom electrode and the adjacent oxide region;
removing a portion of the spacer layer such that a spacer region remains laterally adjacent the sidewall of the bottom electrode;
forming:
(a) a first electrolyte region and first top electrode over a first portion of the pointed tip region of the bottom electrode and a corresponding first portion of the spacer region, such that the first electrolyte region is arranged between the first top electrode and the first portion of the pointed tip region of the bottom electrode to define a first memory element, and the first portion of the spacer region is located laterally between a first portion of the bottom electrode below the first portion of the pointed tip region and a respective portion of the first electrolyte region; and (b) a second electrolyte region and second top electrode over a second portion of the pointed tip region of the bottom electrode and a corresponding second portion of the spacer region, such that the second electrolyte region is arranged between the second top electrode and the second portion of the pointed tip region of the bottom electrode to define a second memory element, and the second portion of the spacer region is located laterally between a second portion of the bottom electrode below the second portion of the pointed tip region and a respective portion of second first electrolyte region.

15. The method according to claim 14, wherein removing a portion of the spacer layer comprises removing a portion of the spacer layer such that the remaining spacer region extends only partially up a height of the bottom electrode sidewall.

16. The method according to claim 14, wherein the spacer layer comprises a dielectric material.

17. The method according to claim 14, wherein the second electrolyte region and second top electrode are physically separate from the first electrolyte region and first top electrode.

18. The method according to claim 14, wherein the resistive memory cell is a conductive bridging memory (CBRAM) cell or a resistive RAM (ReRAM) cell.

19. A method of forming an array of memory elements, comprising:
forming a bottom electrode layer on a substrate;
oxidizing a plurality of exposed regions of the bottom electrode layer to form a plurality of oxide regions spaced apart from each other;
removing regions of the bottom electrode layer between adjacent oxide regions, thereby forming a plurality of bottom electrodes, each bottom electrode having a sidewall and a respective oxide region at an upper side of the bottom electrode and at least one pointed tip region at a top of the sidewall adjacent the respective oxide region;
depositing a spacer layer over the plurality of bottom electrodes and respective oxide regions;
removing portions of the spacer layer such that a spacer region remains laterally adjacent the sidewall of each respective bottom electrode;
for each bottom electrode, forming a pair of memory elements, each memory element defined by a respective region of the bottom electrode pointed tip, a respective top electrode, and an electrolyte region arranged therebetween, and a respective spacer region located laterally between a portion of the bottom electrode sidewall below the tip region and a respective portion of the electrolyte region.

20. The method according to claim 19, wherein each memory element is a conductive bridging memory (CBRAM) cell or a resistive RAM (ReRAM) cell.

* * * * *